United States Patent [19]

Shotey

[11] Patent Number: 4,810,897
[45] Date of Patent: Mar. 7, 1989

[54] TIMER ASSEMBLY WITH WEATHERPROOF HOUSING

[76] Inventor: Michael J. Shotey, 7733 E. Cypress, Scottsdale, Ariz. 85257

[21] Appl. No.: 68,349

[22] Filed: Jul. 1, 1987

[51] Int. Cl.$^4$ ............................................. H05K 5/04
[52] U.S. Cl. ................................. 307/112; 174/52.1
[58] Field of Search ............... 174/52 R, 52 S, 59; 439/296, 345, 434, 577

[56] References Cited

U.S. PATENT DOCUMENTS

| | | | |
|---|---|---|---|
| 2,462,490 | 2/1949 | Hallett | 174/52 S |
| 2,606,218 | 8/1952 | Wickman | 174/52 R |
| 3,646,401 | 2/1972 | Freegard et al. | 174/52 R |
| 3,691,288 | 9/1972 | Sturdivan | 174/52 R |
| 4,152,671 | 5/1979 | Tuma et al. | 174/52 R |
| 4,339,231 | 7/1982 | Conery et al. | 174/52 R |

FOREIGN PATENT DOCUMENTS 2013437  8/1979  United Kingdom ............. 174/52 S

Primary Examiner—Bernard Roskoski
Attorney, Agent, or Firm—Cahill, Sutton & Thomas

[57] ABSTRACT

A timer assembly for automatically controlling outdoor electrical devices such as low voltage lawn sprinkler systems includes a rugged, weatherproof housing for removably containing a conventional, indoor type timer and an optional step-down transformer. The housing comprises a box member, which is divided into two compartments by means of a ledge member, and a cover member hingedly connected to the box member to selectively provide and block access to the compartments. The ledge member comprises a pair of openings for allowing wires to pass between the two compartments. The bottom wall of the box member comprises a pair of openings for allowing input wires to enter the housing and output wires to exit the housing.

9 Claims, 2 Drawing Sheets

TIMER ASSEMBLY WITH WEATHERPROOF HOUSING

BACKGROUND OF THE INVENTION

1. Field of the Invention

This invention relates in general to timer assemblies and, more particularly to an assembly comprising a conventional indoor type timer, and a weatherproof housing for mounting the timer outdoors.

2. Description of the Prior Art

Timers for automatically and periodically turning electrical devices and systems on and off are well known in the art. Generally speaking, such timers include a suitable enclosure in which the various components are mounted to form self-contained structures. Due to the complexity of timing devices per se, the need for skilled technicians and parts availability, the repair of timing devices can be difficult and costly.

The least costly and simplest timer is an indoor plug-in type which is programmable within a twenty-four hour time period and is limited to a single station. That is, a single lamp or other high voltage device is plugged into such a timer.

A second category of timer is an indoor timer which is electrically connected directly into a building's wiring system, as opposed to being plugged in, and is used for high voltage applications. This second type of timer is programmable either over a twenty-four hour time period or within a seven day time period, and is used for controlling high voltage mechanisms.

A third category of timers is very similar to the above discussed second type and is therefore, programmable within either a twenty-four hour or seven day time period and is available as either a single or multiple station device. The difference between these second and third types of timers is that the third type is for low voltage applications and thus requires the use of a step-down transformer.

In that both the second and third types of timers are intended for a variety of uses, they are of more-or-less standard configurations and are enclosed in non-weatherproof enclosures. For these reasons, such timers are relatively inexpensive and are usually replaced by a new timer rather than being repaired in the event of a malfunction.

A fourth category of timing devices is similar to the above discussed second category and is therefore programmable within either a twenty four hour time period or within a seven day time period. This fourth type of timer is available either as a single station or multi-station device and is provided with a weatherproof enclosure for high voltage outdoor use.

Still another category of timing devices is outdoor timers for low voltage applications for controlling low voltage electrical systems such as lighting systems, lawn sprinklers and the like. This fifth category of timer, as in the above described fourth type, is available in either a single station or multiple station configuration with either twenty-four hour or seven day programming capabilities. And, of course, this fifth type of timer must be used with a step-down transformer.

Due to the outdoor mounting requirements of the above discussed fourth and fifth categories of timing devices, they must be contained within weatherproof enclosures which result in more expensive purchasing costs for such devices in comparison to the indoor devices. The less costly outdoor timing devices, i.e. those which are programmable with a twenty-four hour time period and have single station capability, are most often replaced rather than repaired due to the above described difficulties of repair and the costs associated therewith. However, outdoor timers which are programmable over a seven day time period and have multiple station capabilities are very expensive and repair is attempted whenever possible despite the difficulty and costs for such repair.

Therefore, a need exists for a new and useful outdoor timing device which overcomes some of the problems and shortcomings relating to the difficulty or repairing and the costs associated with such repair of the prior art outdoor timing devices.

SUMMARY OF THE INVENTION

In accordance with the present invention, a new and useful outdoor timer assembly is provided. The assembly comprises a conventional indoor type timer of the aforementioned second or third category, and a weatherproof housing for removably containing the timer and protecting it from damage in outdoor conditions. The housing also includes a compartment for holding a plug-in type step-down transformer for use with the third category type of timer.

The weatherproof housing of the assembly comprises a box member, preferably constructed from an inexpensive yet rugged material such as heavy-duty plastic, with a cover member made from the same or similar material hingedly mounted thereon. A sealing member is interposed between the box member and the cover member to prevent water and/or foreign particles from entering the housing.

The box member of the housing comprises a mounting wall, a pair of side walls extending normally to and forwardly of the mounting wall, a top wall extending between the top edges of the side walls, and a bottom wall extending between the bottom edges of the side walls. A ledge member extends forwardly from an intermediate portion of the mounting wall, dividing the box member into two compartments.

The first of these compartments hold an indoor type timer of any commercially available model. The timer includes a plurality of input terminals for connecting the timer directly to a building's wiring system if the timer is of the second category type, or for connecting it to a step-down transformer if the timer is of the third category type. A plurality of output terminals are also included for connecting the timer to a high voltage load if it is a second category type timer, or for connecting it to a low voltage load if it is a third category type timer. An inexpensive, water pervious casing including a hingedly mounted cover member is provided for protecting the input and output terminals from dust and the like. In addition, cooperative elements of a demountable interconnection are provided on the back of the timer casing and on the inner surface of the mounting wall of the housing for demountably securing the timer within the first compartment of the housing.

The second compartment may be left empty if the first compartment contains a high voltage, second category type of timer, but is provided with a mounting platform for receiving a plug-in type step-down transformer if the first compartment contains a low voltage, third category type of timer. The mounting platform comprises an electrical socket for receiving the plug-in prongs of the transformer, and also comprises a set of connector wires for electrically connecting the socket to an electrical conduit or pigtail leading to an external high voltage power source.

Numerous openings are provided in the housing for accommodating various wires in the assembly. More specifically, a first pair of openings is provided in the bottom wall of the second compartment for allowing wires to run into and out of the second compartment, and a second pair of openings is provided in the ledge which separates the first and second compartments for allowing wires to run into and out of the first compartment.

Accordingly, it is an object of this invention to provide an inexpensive outdoor timer assembly with easily replaceable components.

Another object of the invention is to provide a sturdy, weatherproof housing for demountably containing either a high voltage indoor type timer alone or a low voltage indoor type timer together with a step-down transformer.

Still another object of the invention is to provide an outdoor timer housing including a timer compartment provided with demountable fastener means fo attachment to an indoor type timer and a transformer compartment provided with a mounting platform having a socket for receiving the prongs of a plug-in type step-down transformer.

The foregoing and other objects of the present invention, as well as the invention itself, may be more fully understood from the following description when read in conjunction with the accompanying drawings.

DESCRIPTION OF THE PREFERRED EMBODIMENT

Figures 1, 2:
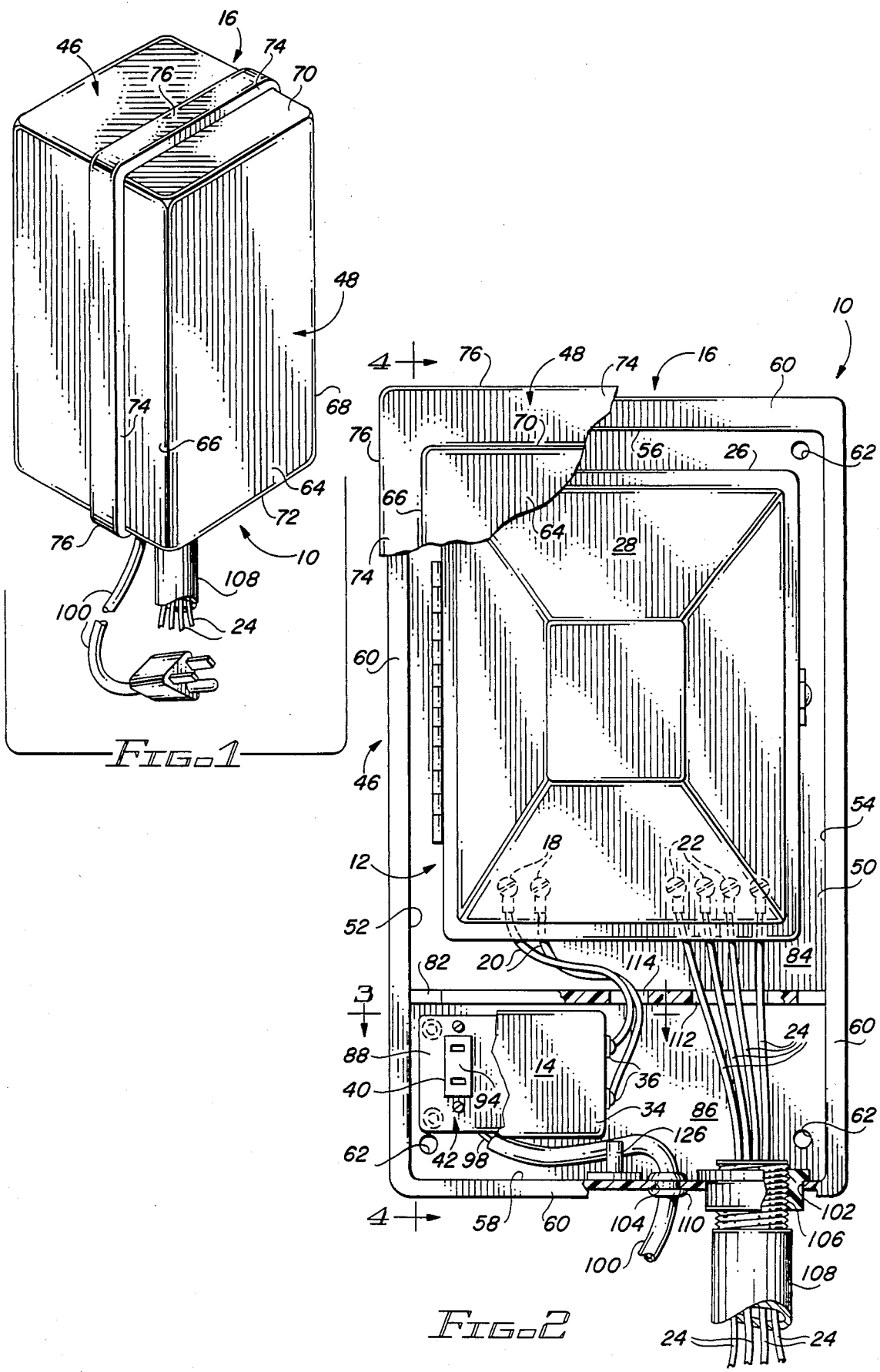
FIG. 1 is a perspective view showing the exterior of the timer assembly of the present invention.
FIG. 2 is an enlarged front view of the timer assembly of the present invention, with the cover of the assembly housing broken away to show the timer and step-down transformer.
Figure 3:
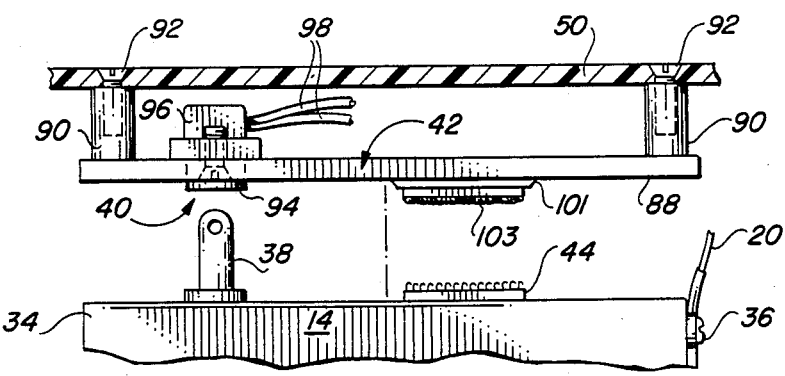
FIG. 3 is an enlarged sectional view taken through line 3—3 of FIG. 2, showing the transformer in exploded relation to its mounting platform.
Figure 4:
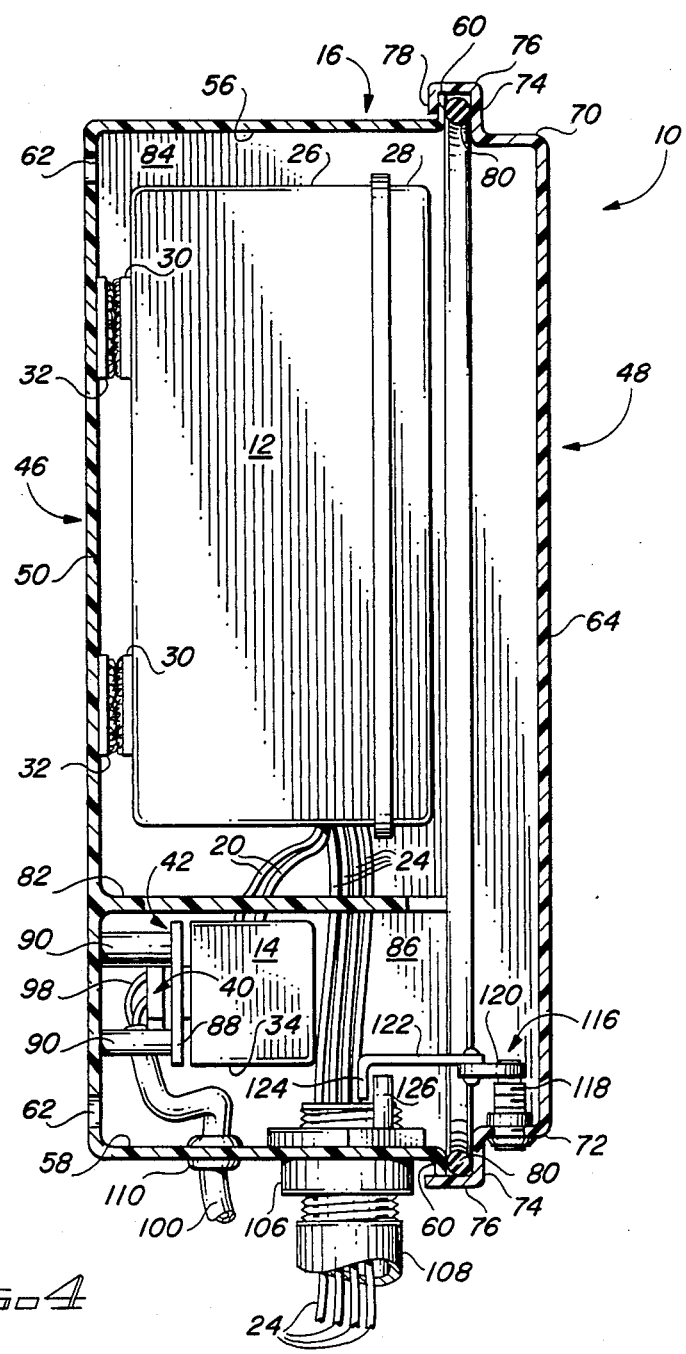
FIG. 4 is a sectional view taken through line 4—4 of FIG. 2.

Referring more particularly to the drawings, FIG. 1 is an external view of the timer assembly of the present invention, indicated in its entirety by the numeral 10. The internal components of the assembly 10, shown in FIGS. 3 and 4, include a conventional, indoor type timer 12, and an optional step-down transformer 14, both of which are encased in a rugged, weatherproof housing 16 which enables the assembly 10 to be safely mounted in an outdoor environment.

The indoor timer 12 may be of any commercially available model such as the type described in U.S. Pat. No. 3,176,395 which is currently identified as model number CRC4A and is available from the Rain Bird Company of Glendora, Calif. 91740. This type of indoor timer is typically used for controlling low voltage outdoor electrical devices such as lawn sprinkler systems, but a high voltage-type of indoor timer may also be used. The timer 12 includes a plurality of input terminals 18 for connecting input wire means 20 which lead from the transformer 14 if the timer 12 is a low voltage-type timer, or from a building's wiring system if the timer 12 is a high voltage-type timer. A plurality of output terminals 22 is also provided for connecting output wires 24 which lead to a low voltage load (not shown) if the timer 12 is a high voltage-type timer, in addition, the timer 12 typically comprises an inexpensive, water pervious casing 26 including a hingedly mounted cover member 28 for protecting the input and output terminals 18, 22 and other components (not shown) from dust and the like. Fastener means 30 are provided on the back wall of the casing 26 for demountably securing the timer 12 within the housing 16. The fastener means 30 illustrated comprise adhesive-backed fabric hook and loop type strips of the type marketed under the trade name "Velcro", which engage mating strips 32 provided on the inner surface of the housing 16, but other fastener means such as snaps, magnets, clips, suction cups and the like could also be used.

The step-down transformer 14, which obviously would be eliminated if timer 12 is a high voltage-type timer, may also be of any commercially available model, such as that identified as model number S17017 from Basier Electric of Highland, Ill. This type of transformer includes an inexpensive, water pervious casing 34, a pair of output terminals 36 to which the low voltage wires 20 leading to the input terminals 18 of timer 12 are connected and a set of electrically conductive prongs 38 (one shown) for plugging the transformer 14 into an electrical socket 40 provided in a mounting platform 42 in housing 16, as will later be described. Additional fastener means 44 such as a hook and loop type strip is also provided on the transformer at a location spaced from the prongs, in order to firmly secure the transformer 14 to the mounting platform 42.

The weatherproof housing 16 is preferably molded from heavy-duty plastic, but may also be constructed from stainless steel, coated metal, or any suitable, inexpensive, waterproof and corrosion-resistant material. The housing 16 comprises two primary pieces, including a box member 46 and a cover member 48. The box member 46 comprises a mounting wall 50, a pair of side walls 52, 54 extending normally to and forwardly of the mounting wall 50, a top wall 56 extending between the top edges of the side walls, and a bottom wall 58 extending between the bottom edges of the side walls. A peripheral flange member 60 extends normally outwardly from the forwardmost edges of the top, bottom and side walls to form a continuous rim around the front of the box member 46. In addition, means such as fastener-receiving holes 62 are provided in the mounting wall 50 for facilitating mounting of the housing 16 on a wall, post or other convenient outdoor structure (not shown).

The cover member 48 comprises a front plate member 64 slightly smaller in dimension than the mounting wall 50 of the box member 46, a pair of spaced apart side walls 66, 68 a top wall 70, and a bottom wall 72. A continuous peripheral flange 74 extends normally to and outwardly from the rearmost edge of the side, top and bottom walls 66, 68, 70, 72. A lip member 76 extends normally to and rearwardly from the outermost edge of the flange to encircle the outwardly extending flange 60 of the box member 46. The top portion of lip member 76 comprises an inwardly turned portion 78 which fits over the top portion of the flange 60 of the box member, thus forming a hinge for pivotably connecting the cover member 48 to the box member 46. A sealing member 80 such as a continuous ring of weatherstripping material is interposed between the outwardly extending flange 60 of the box member 46 and the outwardly extending flange 74 of the cover member 48 for preventing water and/or other foreign particles from entering the housing 16 when the cover member 48 is in its closed position.

The box member 46 of the housing 16 is divided into two compartments by a ledge member 82 which extends parallel to the top and bottom walls 56, 58 of the box member, in an intermediate location thereof. The first of these compartments, timer compartment 84, is provided with hook and loop type strips 32 for mating with strips 30 on the back of timer 12, as previously described, or with equivalent demountable fasteners or fastener-receiving means. The second compartment, transformer compartment 86, is provided with the mounting platform 42 for supporting the step-down transformer 14, as previously mentioned. The mounting platform 42 comprises an essentially flat board member 88 which is supported in spaced relationship to the mounting wall 50 of the housing 16 by a plurality of perpendicularly extending legs 90, which are secured to the mounting wall 50 by means of appropriate fasteners 92 such as screws, bolts, rivets or the like. In addition, the electrical socket 40 for receiving the conductive prongs 38 of the transformer 14 is mounted on the platform, with the front surface 94 of the socket projecting forwardly of the front surface of board member 88, and the back portion 96 of the socket extending behind the back surface of the board member 88. A set of connector wires 98 is attached to the back portion 96 of the socket and is contained in a suitable protective conduit 100 for electrically connecting the socket 40 to a suitable high voltage power source (not shown).

The top surface of the board member 88 of the mounting platform 42 also includes a central raised portion 101, approximately equal in height to the front surface 94 of the socket 40, for supporting a fastener element 103 such as a hook and loop type strip, which mates in demountably interlocking relationship with the fastener element 44 provided on the back of the transformer 14.

In order to accommodate the various wires in the assembly, a number of openings are provided in the housing 16. The bottom wall 58 of the housing comprises two openings, including a first opening 102 through which output wires 24 run, and a second opening 104 through which the high voltage input conduit 100 and wires 98 run. First opening 102 is provided with an internally threaded, ring shaped fitting 106 for demountably receiving a protective pipe 108 made of rugged, electrical insulating material such as polyvinyl-chloride (PVC) for encasing low voltage wires 24 and preventing damage due to unfavorable weather conditions and the like. Second opening 104 may be fitted with a grommet 110 for holding conduit 100 in place.

Ledge member 82 of the housing also comprises two openings, including a first opening 112 through which the wires 24 from the output terminals 22 of the timer 12 pass, and a second opening 114 which receives the low voltage wires 20 connected to the output terminals 36 of the transformer 14 if timer 12 is the low voltage-type. If timer 12 is of the high voltage-type, then electric conduit 100 leading from the high voltage power source (not shown) will be extended upwardly through opening 114 in the ledge 82, as well as through opening 110 in the bottom wall 58 of the housing.

In order to protect the components of the timer assembly 10 from tampering and vandalism, the housing 16 is provided with locking means 116 for preventing unauthorized opening of the cover member 48. In this embodiment, the locking means comprises a key-operated rotatable tumbler 118 mounted in the bottom wall 72 of the cover member 48 of the housing. A flange member 120 extends radially outwardly from an upper end of the tumbler, with an elongated extension member 122 connected to one end of the flange member 120 to reach into the transformer compartment 86 of the box member 46 of the housing 16. The distal end 124 of extension member 122 is bent downwardly behind an upstanding post 126 secured to the bottom wall 58 of the box member 46 of the housing. Thus, when the tumbler 118 is in the locked position, the post 126 obstructs forward movement of the downturned distal end 124 of the extension member 22. However, when the tumbler 118 is rotated into the unlocked position using an appropriate key (not shown), the distal end 124 of the extension member pivots out from behind the post 126, thus allowing the cover member 48 to be swung upwardly about its top hinge and providing access to the interior of the housing 16.

While the principles of the invention have now been made clear in the illustrated embodiments, there will be immediately obvious to those skilled in the art, many modifications of structure, arrangements, proportions, the elements, materials and components used in the practice of the invention and otherwise, which are particularly adapted for specific environments and operation requirements without departing from those principles. The appended claims are therefore intended to cover and embrace any such modifications within the limits only of the true spirit and scope of the invention.

I claim as my invention:

1. A weatherproof housing for demountably receiving and protection a low voltage indoor timer assembly and a step-down transformer, said housing comprising:
    (a) a box member including,
        (i) a mounting wall,
        (ii) a pair of side walls extending in spaced apart relationship from said mounting wall,
        (iii) a top wall extending between said side walls,
        (iv) a bottom wall extending between said side walls, said bottom wall defining a first opening for accommodating exit of low voltage output wires and a second opening for accommodating entry of high voltage input wires,
        (v) a ledge member dividing said box member into a timer compartment and a transformer compartment, said ledge member defining a first opening for accommodating exit of the low voltage output wires from said timer compartment into said transformer compartment and through the first opening of said bottom wall and a second opening for accommodating entry of a set of low voltage input wires from said transformer compartment to said timer compartment,
        (vi) fastener means disposed in said timer compartment for demountably fastening the low voltage indoor timer therein, and
        (vii) a mounting platform for supporting the step-down transformer, said mounting platform including:
            (1) an essentially flat board member; and
            (2) a plurality of legs for supporting said flat board member in spaced relationship to said mounting wall; and (3) fastener means for demountably fastening the step-down transformer with said flat board member, (b) a movable cover member connected to said box member for selectively blocking and allowing access to said timer compartment and said transformer compartment; and (c) sealing means for preventing entrance of foreign elements into said box member when said cover is blocking access to said timer compartment and said transformer compartment.

2. The housing of claim 1, wherein the step-down transformer includes electrically conductive prongs and wherein said mounting platform comprises electrical socket means for receiving the electrically conductive prongs of the step-down transformer.

3. The housing of claim 2, in which said fastener means in said transformer compartment comprises a hook and loop type fastener.

4. The housing of claim 1, in which said box member comprises a peripheral flange member extending normally outwardly from the forwardmost edges of said top, bottom and side walls to form a continuous ring around the front of said box member.

5. The housing of claim 4, in which said cover member comprises:
(a) a front plate member;
(b) a pair of spaced apart side walls extending from said front plate member;
(c) a top wall joining said side walls;
(d) a bottom wall joining said side walls; and
(e) a lip member extending from one of said pair of side walls, top wall and bottom wall for engaging said cover member with said flange member.

6. The housing of claim 5, wherein said sealing means is interposed between said box member and said cover member to prevent entrance of water and foreign particles.

7. The housing of claim 6, in which said housing further comprises locking means for securing said cover means in a closed position with said box means.

8. The housing of claim 1, in which said housing is molded from heavy-duty waterproof plastic.

9. The housing of claim 1 in which said fastener means in said timer compartment comprises a hook and loop fastener.

* * * * *